US009401103B2

(12) United States Patent
Wilcox et al.

(10) Patent No.: US 9,401,103 B2
(45) Date of Patent: Jul. 26, 2016

(54) LED-ARRAY LIGHT SOURCE WITH ASPECT RATIO GREATER THAN 1

(75) Inventors: Kurt S. Wilcox, Libertyville, IL (US); Bernd Keller, Santa Barbara, CA (US); Ted Lowes, Lompoc, CA (US); Peter S. Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 653 days.

(21) Appl. No.: 13/441,558

(22) Filed: Apr. 6, 2012

(65) Prior Publication Data

US 2012/0306351 A1 Dec. 6, 2012

Related U.S. Application Data

(63) Continuation-in-part of application No. 13/021,496, filed on Feb. 4, 2011.

(51) Int. Cl.

*H01L 29/18* (2006.01)
*H01L 33/00* (2010.01)
*G09F 9/33* (2006.01)
*G09F 19/22* (2006.01)

(52) U.S. Cl.

CPC ................ *G09F 9/33* (2013.01); *G09F 19/228* (2013.01)

(58) Field of Classification Search

CPC ........ G09F 19/228
USPC ........ 257/88
See application file for complete search history.

(56) References Cited

U.S. PATENT DOCUMENTS

| | | | | |
|---|---|---|---|---|
| 4,918,497 | A | 4/1990 | Edmond | |
| 4,966,862 | A | 10/1990 | Edmond | |
| 5,027,168 | A | 6/1991 | Edmond | |
| 5,125,153 | A | 6/1992 | Frey et al. | |
| 5,210,051 | A | 5/1993 | Carter, Jr. | |
| 5,337,179 | A | 8/1994 | Hodges | |
| 5,338,944 | A | 8/1994 | Edmond et al. | |
| 5,393,993 | A | 2/1995 | Edmond et al. | |
| 5,416,342 | A | 5/1995 | Edmond et al. | |
| 5,523,589 | A | 6/1996 | Edmond et al. | |
| 5,604,135 | A | 2/1997 | Edmond et al. | |
| 5,631,190 | A | 5/1997 | Negley | |
| 5,739,554 | A | 4/1998 | Edmond et al. | |
| 5,912,477 | A | 6/1999 | Negley | |
| 6,120,600 | A | 9/2000 | Edmond et al. | |
| 6,187,606 | B1 | 2/2001 | Edmond et al. | |
| 6,188,527 | B1 * | 2/2001 | Bohn | 359/710 |
| 6,201,262 | B1 | 3/2001 | Edmond et al. | |
| 6,791,119 | B2 | 9/2004 | Slater, Jr. et al. | |
| 6,853,010 | B2 | 2/2005 | Slater, Jr. et al. | |
| 7,141,825 | B2 | 11/2006 | Horio et al. | |
| 7,213,940 | B1 | 5/2007 | Van De Ven et al. | |
| 7,285,801 | B2 | 10/2007 | Eliashevich et al. | |
| 7,326,583 | B2 | 2/2008 | Andrews et al. | |
| 7,442,564 | B2 | 10/2008 | Andrews | |
| 7,476,337 | B2 | 1/2009 | Sakane et al. | |
| 7,521,728 | B2 | 4/2009 | Andrews | |

(Continued)

*Primary Examiner* — Matthew Landau
*Assistant Examiner* — Igwe U Anya
(74) *Attorney, Agent, or Firm* — Jansson Munger; McKinley & Kirby Ltd.

(57) ABSTRACT

An LED light source for use in LED lighting fixtures, the LED light source comprising a submount including an LED-populated area which has an aspect ratio greater than 1, an array of LEDs on the LED-populated area, and a lens on the submount over the LED-populated area. Various embodiments facilitating preferential-side lighting, such as for roadway uses, are also disclosed.

75 Claims, 7 Drawing Sheets

(56) References Cited

U.S. PATENT DOCUMENTS

| | | | | |
|---|---|---|---|---|
| 7,646,035 | B2 | 1/2010 | Loh et al. | |
| 7,649,209 | B2 | 1/2010 | Hussell et al. | |
| 7,652,298 | B2 | 1/2010 | Chen et al. | |
| D615,504 | S | 5/2010 | Keller et al. | |
| 7,709,853 | B2 | 5/2010 | Medendorp, Jr. | |
| 7,733,488 | B1 | 6/2010 | Johnson | |
| 7,737,634 | B2 | 6/2010 | Leng et al. | |
| 7,763,478 | B2 | 7/2010 | Loh et al. | |
| 7,800,125 | B2 | 9/2010 | Chen | |
| 7,821,023 | B2 | 10/2010 | Yuan et al. | |
| 7,829,899 | B2 | 11/2010 | Hutchins | |
| 7,850,887 | B2 | 12/2010 | Loh et al. | |
| 7,854,365 | B2 | 12/2010 | Li et al. | |
| 8,092,051 | B2 | 1/2012 | Helbing | |
| 2002/0043926 | A1 | 4/2002 | Takahashi et al. | |
| 2002/0123164 | A1 | 9/2002 | Slater et al. | |
| 2003/0006418 | A1 | 1/2003 | Emerson et al. | |
| 2003/0089918 | A1 | 5/2003 | Hiller et al. | |
| 2004/0056260 | A1 | 3/2004 | Slater et al. | |
| 2004/0207816 | A1* | 10/2004 | Omoda et al. | 353/31 |
| 2005/0127485 | A1 | 6/2005 | Shei et al. | |
| 2006/0124953 | A1 | 6/2006 | Negley et al. | |
| 2006/0163589 | A1 | 7/2006 | Fan et al. | |
| 2006/0208271 | A1 | 9/2006 | Kim et al. | |
| 2006/0255353 | A1 | 11/2006 | Taskar et al. | |
| 2007/0200128 | A1 | 8/2007 | Yano | |
| 2008/0043465 | A1* | 2/2008 | Chou et al. | 362/235 |
| 2008/0089053 | A1 | 4/2008 | Negley | |
| 2008/0191225 | A1 | 8/2008 | Medendorp | |
| 2008/0217635 | A1 | 9/2008 | Emerson et al. | |
| 2008/0239722 | A1* | 10/2008 | Wilcox | F21V 5/04 362/268 |
| 2008/0315214 | A1 | 12/2008 | Wall, Jr. et al. | |
| 2009/0050907 | A1* | 2/2009 | Yuan et al. | 257/88 |
| 2009/0050908 | A1 | 2/2009 | Yuan et al. | |
| 2009/0108281 | A1 | 4/2009 | Keller et al. | |
| 2009/0145647 | A1 | 6/2009 | Tanaka et al. | |
| 2009/0283787 | A1 | 11/2009 | Donofrio et al. | |
| 2009/0290360 | A1 | 11/2009 | Wilcox et al. | |
| 2009/0315061 | A1 | 12/2009 | Andrews | |
| 2010/0109030 | A1 | 5/2010 | Krames et al. | |
| 2010/0155763 | A1 | 6/2010 | Donofrio et al. | |
| 2010/0230693 | A1 | 9/2010 | Tran | |
| 2010/0308354 | A1 | 12/2010 | David et al. | |
| 2011/0001149 | A1 | 1/2011 | Chan et al. | |
| 2011/0006334 | A1 | 1/2011 | Ishii et al. | |
| 2011/0018013 | A1 | 1/2011 | Margalith et al. | |
| 2011/0204261 | A1 | 8/2011 | Dahm et al. | |
| 2011/0254042 | A1* | 10/2011 | Shaikevitch | 257/98 |
| 2012/0193649 | A1* | 8/2012 | Donofrio et al. | 257/88 |
| 2012/0193662 | A1 | 8/2012 | Donofrio et al. | |
| 2012/0199852 | A1 | 8/2012 | Lowes et al. | |
| 2012/0307503 | A1 | 12/2012 | Wilcox et al. | |
| 2013/0092960 | A1 | 4/2013 | Wilcox et al. | |

* cited by examiner

LED-ARRAY LIGHT SOURCE WITH ASPECT RATIO GREATER THAN 1

RELATED APPLICATION

This application is a continuation-in-part of patent application Ser. No. 13/021,496, filed Feb. 4, 2011, currently pending. The contents of the parent application are incorporated herein by reference.

FIELD OF THE INVENTION

This invention relates generally to the field of LED lighting fixtures and, more particularly, to the field of LED-based light sources for use in fixtures with specific light-distribution requirements.

BACKGROUND OF THE INVENTION

In recent years, the use of light-emitting diodes (LEDs) for various common lighting purposes has increased, and this trend has accelerated as advances have been made in LEDs, LED arrays, and specific components. Indeed, lighting applications which previously had typically been served by fixtures using what are known as high-intensity discharge (HID) lamps are now being served by LED lighting fixtures. Such lighting applications include, among a good many others, roadway lighting, factory lighting, parking lot lighting, and commercial building lighting.

In many of such products, achieving high levels of illumination over large areas with specific light-distribution requirements is particularly important. One example is fixtures for roadway lighting, an application in which the fixtures are generally placed along roadway edges while light distribution is desired along a significant portion of roadway length and, of course, on the roadway itself—generally to the exclusion of significant light off the roadway. And in such situations it is desirable to minimize the use of large complex reflectors and/or varying orientations of multiple light sources to achieve desired illumination patterns.

SUMMARY OF THE INVENTION

The present invention is an LED light source which satisfies all of the above-noted objects and purposes. The LED light source of this invention comprises a submount including an LED-populated area which has an aspect ratio greater than 1, an array of LEDs on the LED-populated area, and a lens on the submount over the LED-populated area.

As used herein, the term "LED-populated area" means an area (i.e., an area on the submount) the outer boundaries of which include the outermost edges of the outermost LEDs (of the LED array) in any direction. As used herein, the term "aspect ratio" means the ratio of the maximum cross-dimension of the LED-populated area to the maximum of the cross-dimensions orthogonal thereto.

In certain embodiments of the inventive LED light source, the spacing and arrangement of the LEDs of the array are such that the total LED area is at least about one-third of the LED-populated area. In some embodiments, the spacing and arrangement of the LEDs of the array are such that the total LED area is at least about two-thirds of the LED-populated area, and in some of these embodiments, the spacing and arrangement of the LEDs of the array are such that the total LED area is about 90% of the LED-populated area.

As used herein, the term "total LED area" means the sum of the submount areas immediately beneath each of the LEDs of the LED array.

In certain other embodiments, the spacing between LEDs of the array is no more than about 1 millimeter (mm), and in some of these embodiments, the spacing between LEDs is no more than about 0.5 mm, and sometimes no more than about 0.1 mm. And in certain other embodiments, the spacing is no more than about 0.075 mm, and even no more than about 0.05 mm.

In other embodiments of this invention, the aspect ratio of the LED populated area is at least about 1.25. In some of these embodiments, the aspect ratio is at least about 1.5, and in other embodiments, aspect ratio is at least about 2.

The LED-populated area in some embodiments is rectangular. For example, one such embodiment includes a rectangular array of LED's including at least eight LEDs positioned in two rows of four LEDs in each row. In another, the array includes forty-eight LEDs positioned in four rows of twelve LEDs in each row. In certain other embodiments, the LED-populated area is asymmetric.

"Asymmetric," as used herein with respect to LED-populated areas, when unmodified by any further limiting description, refers to an area the boundary of which is a geometric shape having no more than one axis around which there is bilateral symmetry. Therefore, it should be understood that LED-populated areas which are rectangular are not asymmetric, given that they have two axes around which there is bilateral symmetry.

In certain embodiments of this invention, the LED light source is configured to refract LED-emitted light toward a preferential direction. The LED array defines an emitter axis, and in certain embodiments the lens has an outer surface and a centerline which is offset from the emitter axis toward the preferential direction. In some of these embodiments, the lens is shaped for refraction of LED-emitted light toward the preferential direction. The lens may be asymmetric.

As used herein, the term "emitter axis" means the line orthogonal to the plane defined by the LED-populated area and passing through the geometric center of the minimum-area rectangle bounding the LED-populated area, i.e., the center of the rectangle of minimum area which includes all of the LED-populated area.

The term "asymmetric," as used herein with respect to lenses, when unmodified by any further limiting description, refers to a lens shape which is not rotationally symmetric about any axis perpendicular to its base plane. Types of asymmetric lenses include without limitation bilaterally symmetric lenses.

In some embodiments in which the light source is configured to refract LED-emitted light toward a preferential direction, the LED-populated area has major and minor orthogonal cross-dimensions and the preferential direction is along the minor cross-dimension, thereby to provide an illumination pattern which is offset toward the preferential direction with respect to the emitter axis.

In certain embodiments of this invention, the lens is overmolded on the submount. The submount may comprise ceramic material, and may be aluminum nitride. The submount has front and back sides, and the LED-populated area may be on the front side, with electrodes on the back side for connection purposes.

The light source of this invention may also be described as comprising (a) a submount including an LED-populated area with an array of light-emitting diodes (LEDs) thereon, the LED-populated area having first and second maximum cross-dimensions orthogonal to one another where the first cross-dimension is greater than the second cross-dimension, and (b) a lens on the submount over the LED-populated area.

In descriptions of this invention, including in the claims below, the terms "comprising," "including" and "having" (each in their various forms) and the term "with" are each to be understood as being open-ended, rather than limiting, terms.

DETAILED DESCRIPTION OF CERTAIN EMBODIMENTS

Figure 1:
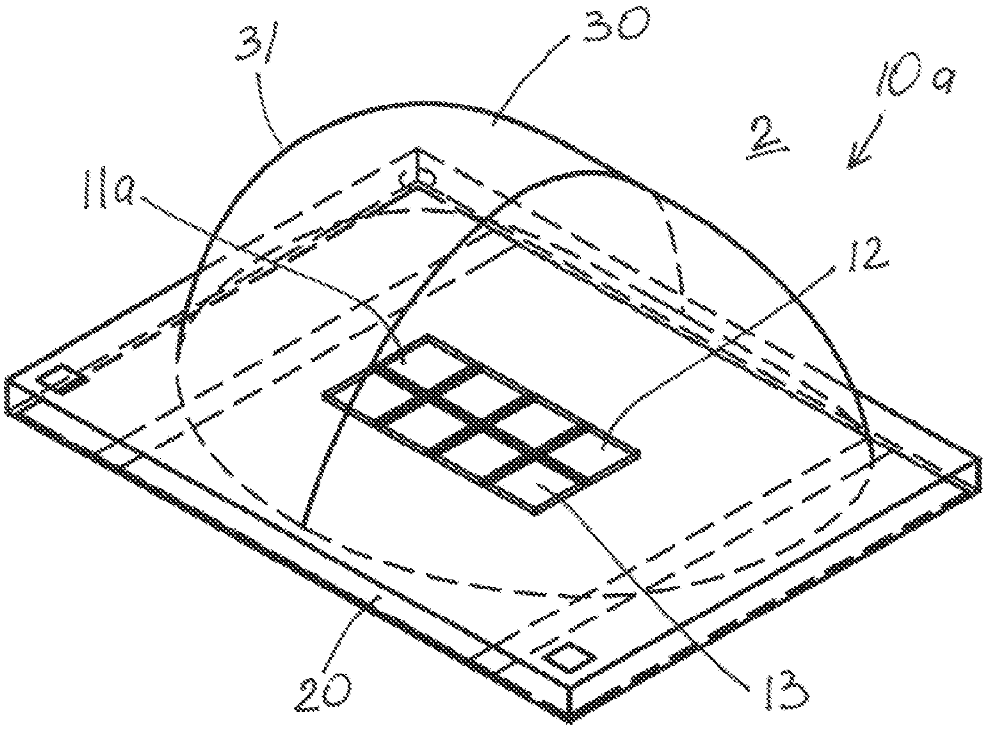
FIG. 1 is an enlarged perspective view of one embodiment of the LED light source according to the present invention and including an array of eight LEDs diodes and an asymmetric primary lens overmolded over the LED array.

FIGS. 1-15 illustrate an LED light source 10 of this invention. Light source 10 includes a submount 20 including an LED-populated area 11 which has an aspect ratio greater than 1, an array 12 of LEDs 13 on LED-populated area 11, and a lens 30 on submount 20 over LED-populated area 11.

Figure 15:
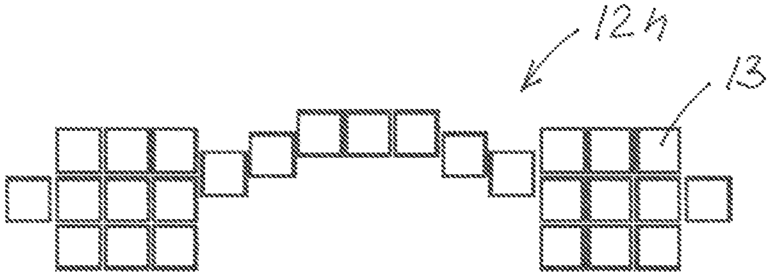
FIG. 15 is an enlarged plan view of still another alternative configuration of an LED array according to the present invention.
Figure 15A:
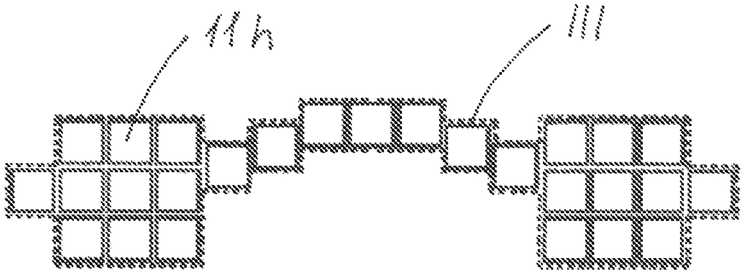
FIG. 15A is an exemplary illustration of outer boundaries of an LED-populated area of the LED array of FIG. 15.
Figure 15B:
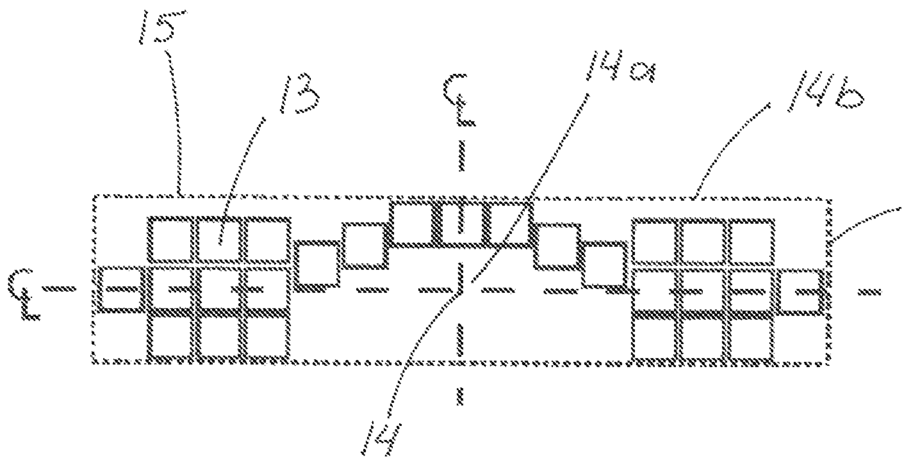
FIG. 15B is an exemplary illustration of the location of an emitter axis of LED array of FIG. 15, and is an exemplary illustration of two orthogonal maximum cross-dimensions for the purpose of determination of an aspect ratio of an LED-populated area of FIG. 15A.

FIG. 15A illustrates an example of outer boundaries 111 of LED-populated area 11. FIG. 15B is an exemplary illustration of two orthogonal maximum cross-dimensions for the purpose of determination of an aspect ratio of a particular LED-populated area 11.

Figure 2:
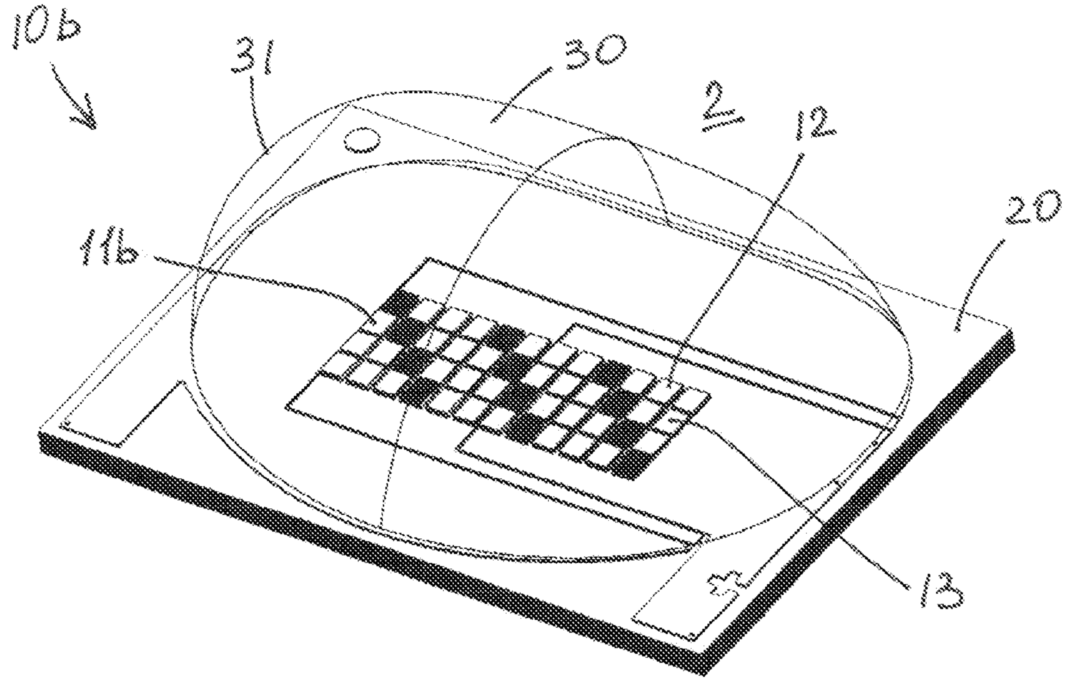
FIG. 2 is an enlarged perspective view of another embodiment of the LED light source according to the present invention and including an array of forty-eight LEDs and an asymmetric primary lens overmolded over the LED array.
Figure 3:
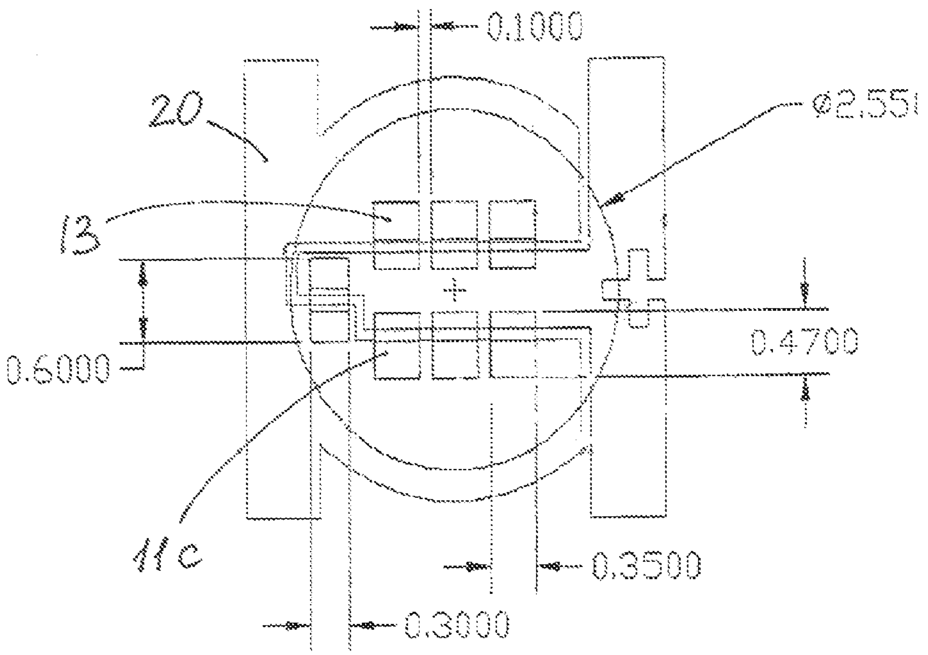
FIG. 3 is an enlarged plan view of an alternative LED array according to the present invention and having an asymmetric shape.
Figure 6:
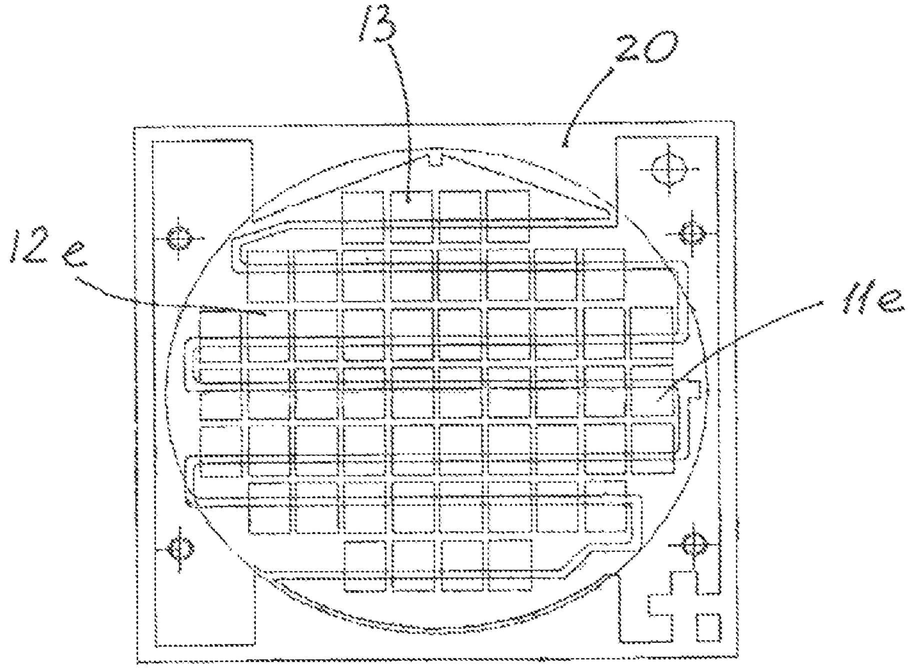
Figure 7:
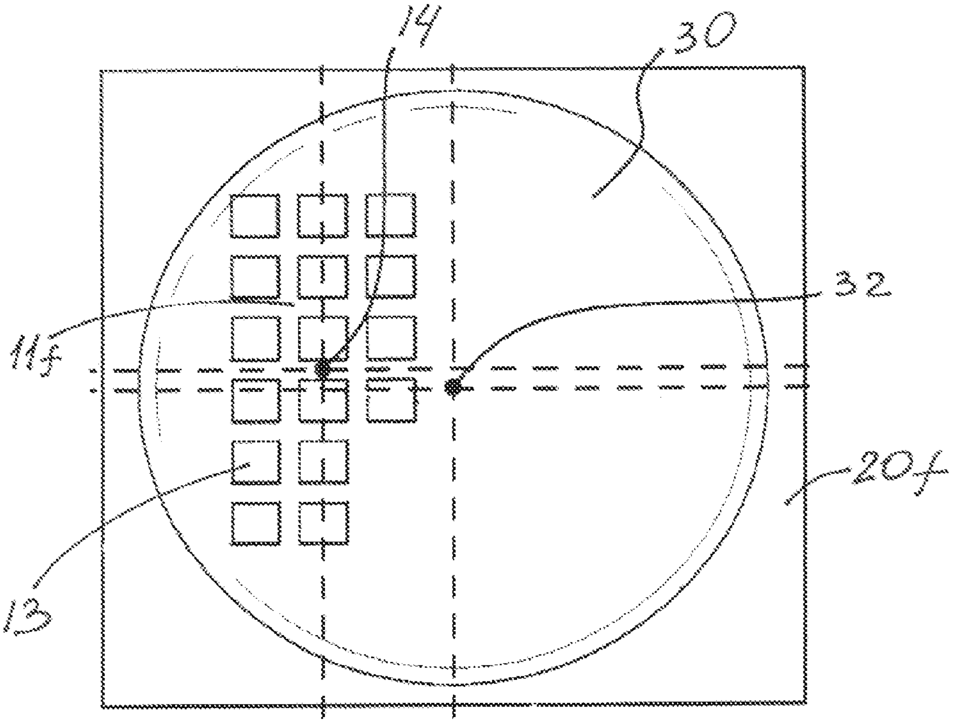
FIG. 7 is an enlarged plan view of another alternative LED array according to the present invention and having an asymmetric shape.
Figure 8:
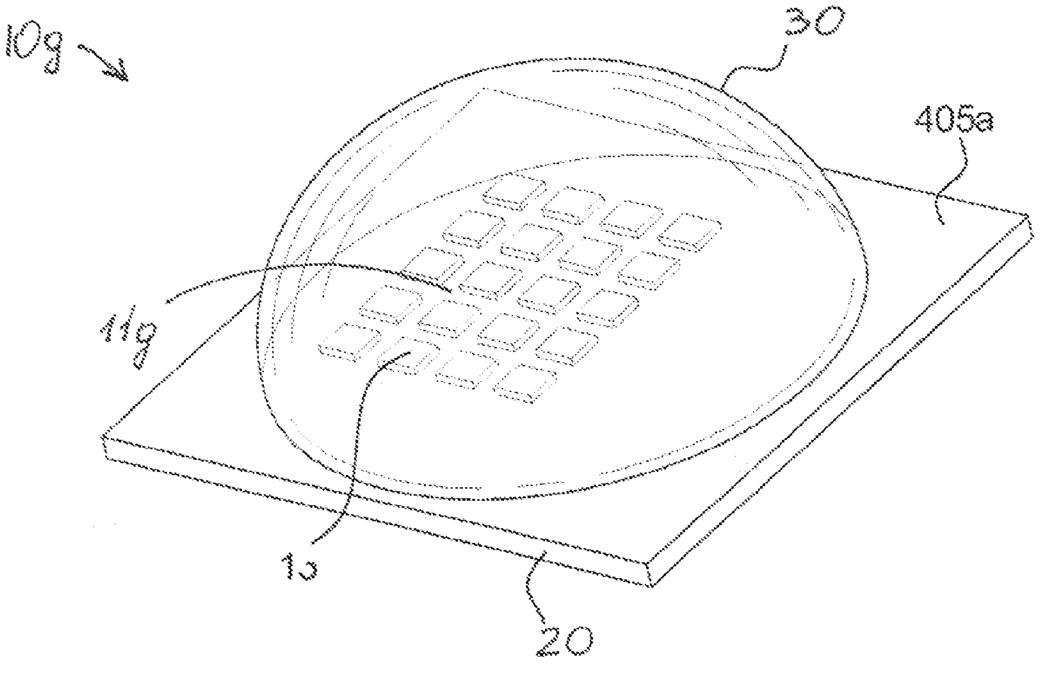
FIG. 8 is an enlarged perspective view of yet another embodiment of the LED light source according to the present invention and including a hemispheric primary lens overmolded over an LED array.

FIGS. 1-8 also show that the spacing and arrangement of the LEDs 13 on each LED-populated area 11 is such that the total LED area is at least about one-third of LED-populated area 11, as seen in FIGS. 3 and 15. In FIGS. 7 and 8, the spacing and arrangement of the LEDs 13 are such that the total LED area is at least about two-thirds of the respective LED-populated areas 11*f* and 11*g*. In FIGS. 1, 2, 4-6, the spacing and arrangement of the LEDs 13 are such that the total LED area is at least about 90% of LED-populated areas 11*a*, 11*b*, 11*d* and 11*e*.

Figure 4:
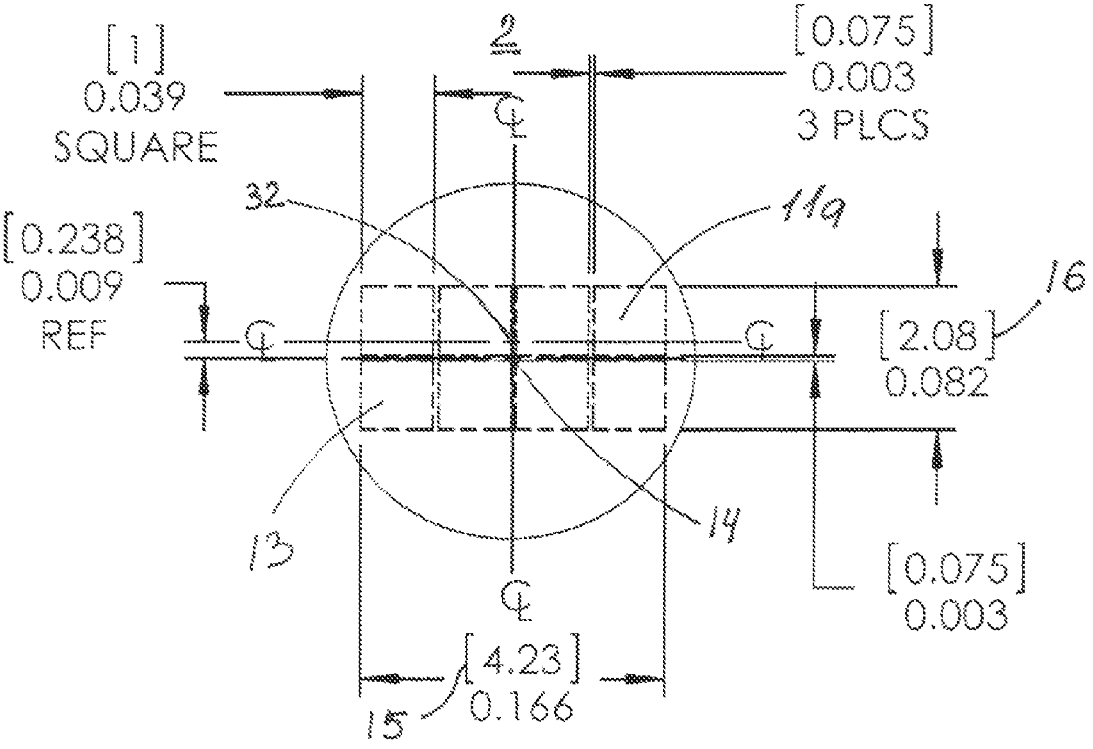
FIG. 4 is an enlarged plan view of the LED array of the LED light source of FIG. 1 and showing main dimensions of the LED array.
Figure 5:
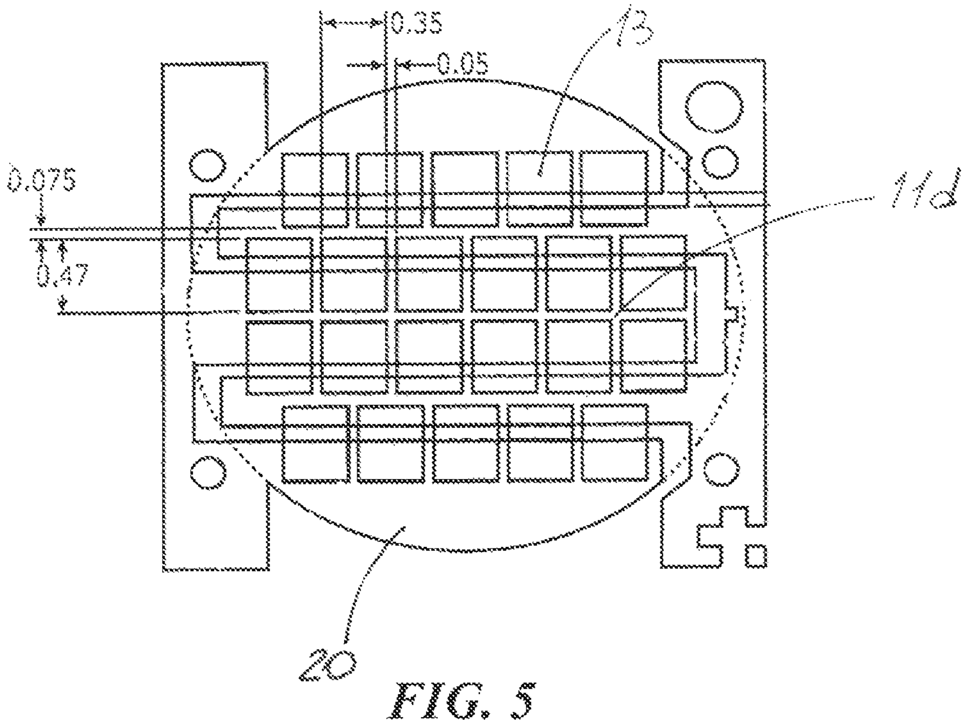
FIGS. 5 and 6 are enlarged plan views of yet more alternative LED arrays each configured according to the present invention.

FIG. 3 shows the spacing between LEDs 13 of array 11*c* is about 0.1 mm. In FIG. 4, the spacing between LEDs 13 of array 11*a* is about 0.075 mm. And, in FIG. 5, the spacing between LEDs 13 of array 11*d* is about 0.05 mm.

Figure 9:
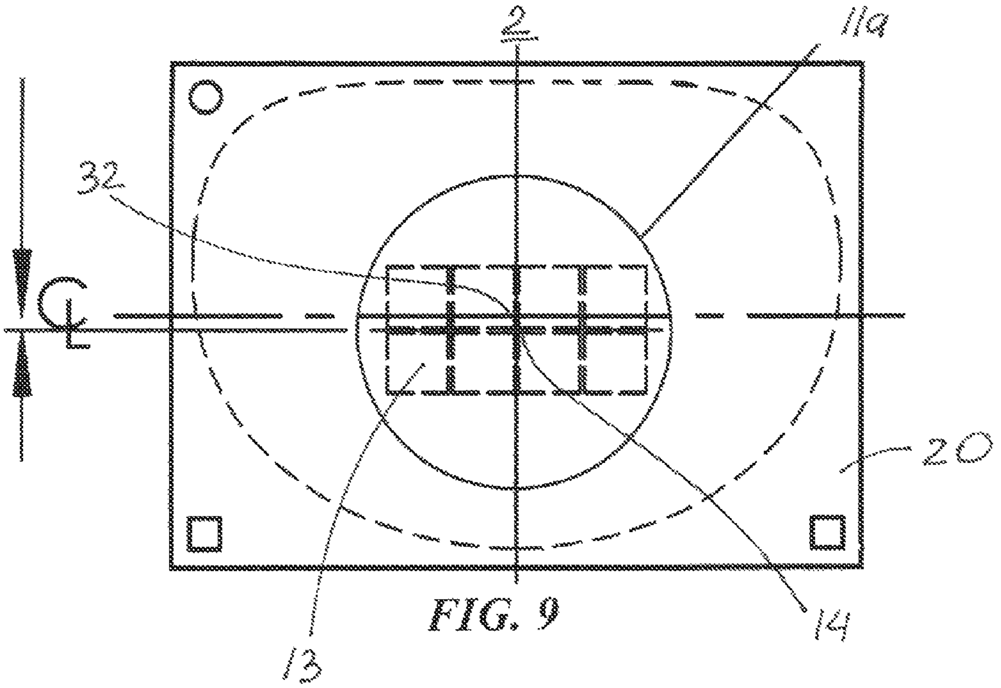
FIG. 9 is an enlarged plan view of the LED light source of FIG. 1.
Figure 10:
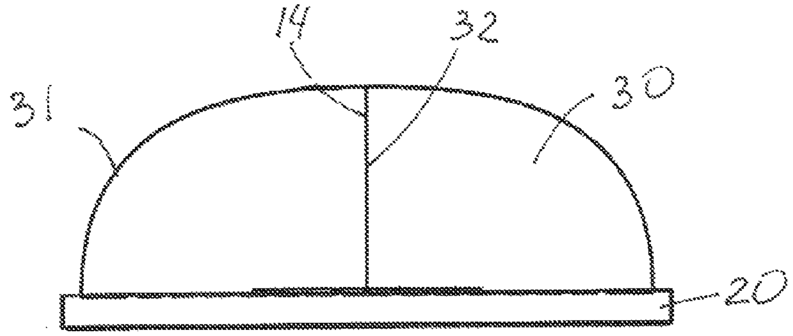
FIG. 10 is an enlarged front elevation of the LED light source of FIG. 1.
Figure 11:
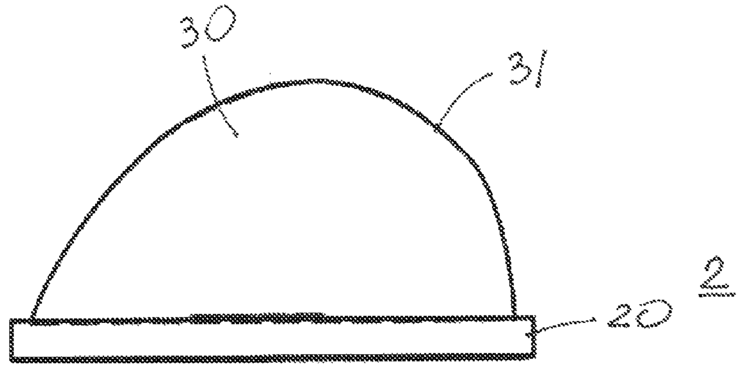
FIG. 11 is an enlarged side elevation of the LED light source of FIG. 1.

FIGS. 1-8 and 15 illustrate various configurations of LED-populated areas 11*a-h* with aspect ratios of at least about 1.25, at least about 1.5 and at least about 2. FIGS. 1, 4 and 9 show LED light source 10*a* including rectangular LED-populated area 11*a* with eight LEDs 13 arranged in two rows of four LEDs 13 in each row. In FIG. 6, dimensions are indicated in millimeters in brackets, the first maximum cross dimension being [2.08], i.e., 2.08 millimeters, and indicated in inches under the brackets. FIG. 2 shows LED emitter 10*b* including forty-eight LEDs 13 arranged in four rows of twelve LEDs 13 in each row. The aspect ratios of LED-populated area 11*a* is about 2 and the aspect ratio of LED-populated area 11*b* is about 3.

FIGS. 3 and 7 illustrate LED arrays 11*c* and 11*f* with LEDs 13 arranged in asymmetric configurations each having an aspect ratio greater than 1.

FIGS. 1, 2 and 7-11 illustrate various versions of LED light source 10 configured to refract LED-emitted light toward a preferential direction 2. Each LED array defines an emitter axis 14. FIGS. 1, 2 and 7-11 illustrate lens 30 as configured to refract LED-emitted light toward preferential side 2. FIGS. 1, 2 and 9-11 show a lens outer surface 31 shaped for refraction of LED-emitted light toward preferential side 2. FIGS. 4, 7 and 9 show lens outer surface 31 having a centerline 32 offset from emitter axis 14 toward preferential side 2. FIGS. 1, 2 and 9-11 show LED light source 10 which has both lens outer surface 31 having its centerline 32 offset from emitter axis 14 toward preferential side 2 and also being shaped for refraction of LED-emitted light toward preferential side 2. In FIGS. 1 and 2, lens 30 is shown as asymmetric.

FIG. 4 illustrates that LED-populated area 11 a has a first cross-dimension 15 and a second cross-dimension 16 orthogonal to cross-dimension 15 where first cross-dimension 15 is greater than second cross-dimension 16. Preferential direction 2 is along minor cross-dimension 16, thereby providing an illumination pattern which is offset toward preferential direction 2 with respect to emitter axis 14. Examples of such illumination patterns are asymmetric illumination patterns such as type III or type IV light distribution patterns used for roadway lighting, as established by the Illuminating Engineering Society (IES).

FIG. 15B is also an exemplary illustration of a position of emitter axis 14 passing through geometric center 14*a* of minimum-area rectangle 14*b* bounding LED-populated area 11.

Figure 12:
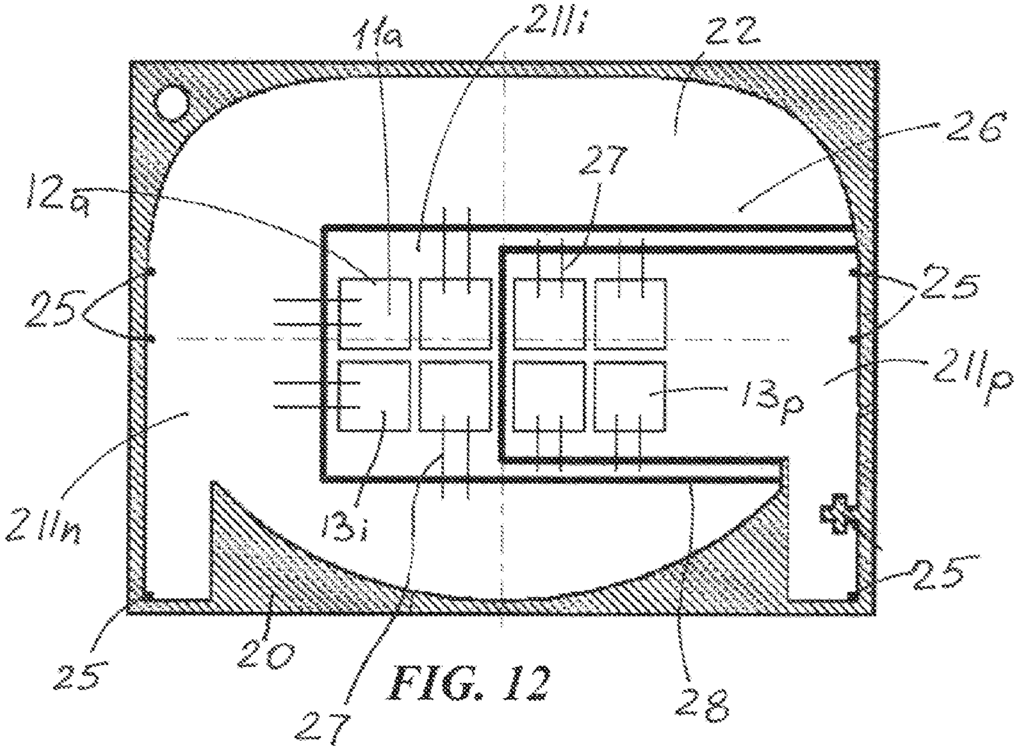
FIG. 12 is an enlarged front-side view of a submount of the LED light source of FIG. 1 showing the eight LEDs on the submount.
Figure 13:
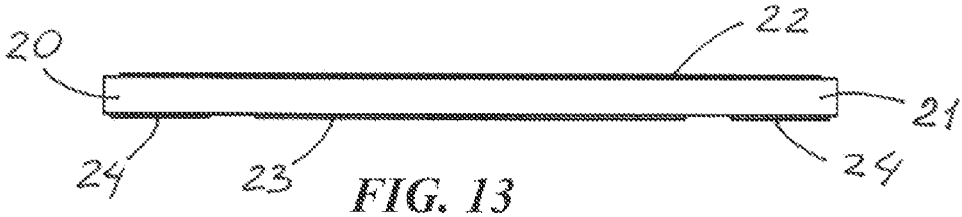
FIG. 13 is a lateral-side view of the submount of FIG. 12.
Figure 14:
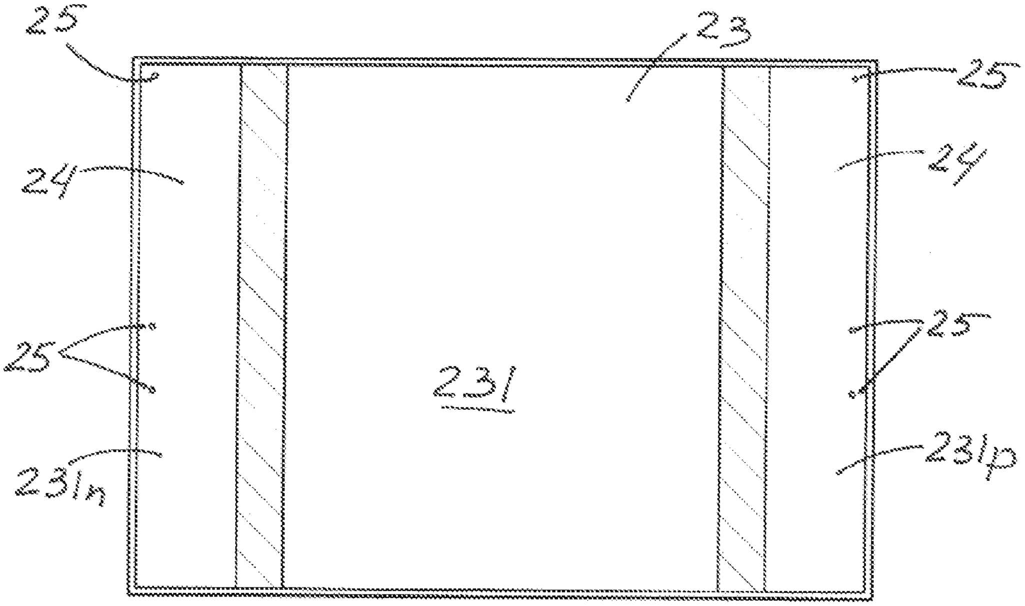
FIG. 14 is a back-side view of the submount of FIG. 12.

In FIGS. 1, 2 and 7-9, lens 30 is overmolded on submount 20. FIGS. 12-14 show submount 20 comprising ceramic material 21. It is further seen in FIGS. 12-14 that submount 20 has a front side 22 and a back side 23 with LED-populated area 11 being on front side 22. Light source 10 has electrodes 24 on back side 23 for electrical connection of LED light source 10.

FIG. 12 best illustrates that submount 20 on its front side 22 includes three contact pads: positive contact pad 211*p*; intermediate contact pad 211*i*; and negative contact pad 211*n*. Each such contact pad is deposited onto ceramic layer 21 by a metallization process. The geometric configuration of the three contact pads 211*p*, 211*i* and 211*n* is such that LED array 12 can be conveniently laid out in a rectangular pattern shown in FIGS. 1 and 2. Numerous other patterns are possible as are numerous other geometric configurations of the contact pads. Such other configurations and patterns are not limited by the embodiments shown.

FIG. 13 best illustrates ceramic layer 21 on which contact pads 211 (211*p*, 211*i* and 211*n*) are deposited.

FIG. 14 illustrates mounting pads 231, 231*p* and 231*n* also deposited onto ceramic layer 21 on back side 23 of submount 20 also by the metallization process. Mounting pads 231*p* and 231*n* are electrically-connected to contact pads 211*p* and 211*n*, respectively, with vias 25 which pass through ceramic layer 21 with metallization, thereby enabling mounting pads 231*p* and 231*n* to serve as electrical connections to a printed circuit board 26 or other structure for light source 10. Mounting pad 231 is electrically-isolated from mounting pads 231*p* and 231*n* and serves for heat conduction from the LEDs 13. The electrical isolation of mounting pad 231 may be done with a solder mask.

Contact pad metallization layers include a titanium layer, a copper layer and a silver layer on a portion of aluminum nitride ceramic layer 21. The silver layer may be the outmost layer on both front and back sides. The copper layer is an intermediate layer between silver and titanium. And, the titanium layer may be the innermost layer applied directly to ceramic layer 21. Approximate layer thicknesses may be as follows: aluminum ceramic layer 309 is or about 0.50 mm; titanium layer 315 is or about 0.06 microns; copper layer 317 is or about 50 microns; and silver layer 319 is or about 3.5 microns.

FIG. 12 further illustrates LED array 12*a* with eight LEDs 13 with four LEDs 13*p* bonded onto positive contact pad 211*p* and four LEDs 13*i* bonded onto intermediate contact pad 211*i*. LEDs 13 are bonded onto the corresponding contact pads with the anode sides (p-type material) contacting the contact pads. The opposite sides of each LED 13 are cathode sides (n-type material), and the cathode sides are wirebonded to other contact pads to complete the electrical circuit of LED light source 10. Gaps 28 between contact pads 211 provide electrical isolation therebetween.

FIG. 12 also illustrates wirebonding connections 27 to each LED 13 as follows: the cathode sides of each of the four LEDs 13*p* bonded to positive contact pad 211*p* are wirebonded to intermediate contact pad 211*i* with two wirebond connections 27; and the cathode sides of each of the four LEDs 13*i* bonded to intermediate contact pad 211*i* are wirebonded to negative contact pad 211*n* with two wirebond connections 27.

Therefore, each of LEDs 13*p* is connected to a positive power terminal at contact pad 211*p*, such positive electrical connection being first made at mounting pad 231*p* and connected to contact pad 211*p* through vias 25. Electric current then flows through each LED 13*p* and through wirebond connections 27 to intermediate contact pad 211*i*. The electric current continues to flow through each LED 13*i* which is bonded at its anode side to intermediate contact pad 211*i*. Electric current then continues to flow through negative contact 2111 and then to negative mounting pad 231*n* which is connected to negative contact pad 211*n* through vias 25.

In essence, the connectivity of LED array 12*a* is four serial pairs of LEDs 13 wired in parallel to each other pair. Positive contact 211*p* is connected to the positive terminal of a DC driver circuit (not shown) and negative contact pad 211*n* is connected to the negative terminal of such driver circuit.

The double wirebond connection on each LED 13 provides electrical redundancy for each LED 13 to minimize total failure of any of LEDs 13, i.e. that if one wirebond fails the second wirebond would provide the necessary electrical connection.

While the principles of the invention have been shown and described in connection with specific embodiments, it is to be understood that such embodiments are by way of example and are not limiting.

The invention claimed is:

1. An LED light source configured to direct LED-emitted light toward a preferential side, the light source comprising:
- a submount including an LED-populated area which has an aspect ratio greater than 1 and major and minor orthogonal cross-dimensions, the preferential side being along the major cross-dimension;
- an array of LEDs on the LED-populated area, the minor cross-dimension being defined by more than one LED; and
- a lens on the submount over the LED-populated area.

2. The LED light source of claim 1 wherein the spacing and arrangement of the LEDs are such that the total LED area is at least about one-third of the LED-populated area.

3. The LED light source of claim 1 wherein the spacing and arrangement of the LEDs are such that the total LED area is at least about two-thirds of the LED-populated area.

4. The LED light source of claim 3 wherein the spacing and arrangement of the LEDs are such that the total LED area is about 90% of the LED-populated area.

5. The LED light source of claim 3 wherein the spacing between LEDs is no more than about 1 millimeter.

6. The LED light source of claim 5 wherein the spacing between LEDs is no more than about 0.5 millimeters.

7. The LED light source of claim 6 wherein the spacing between LEDs is no more than about 0.1 millimeters.

8. The LED light source of claim 7 wherein the spacing between LEDs is no more than about 0.075 millimeters.

9. The LED light source of claim 8 wherein the spacing between the LEDs is no more than about 0.05 millimeters.

10. The LED light source of claim 1 wherein the aspect ratio is at least about 1.25.

11. The LED light source of claim 10 wherein the aspect ratio is at least about 1.5.

12. The LED light source of claim 11 wherein the aspect ratio is at least about 2.

13. The LED light source of claim 1 wherein the LED-populated area is rectangular.

14. The LED light source of claim 13 wherein the array includes at least eight LEDs positioned in two rows of four LEDs in each row.

15. The LED light source of claim 13 wherein the array includes forty-eight LEDs positioned in four rows of twelve LEDs in each row.

16. The LED light source of claim 1 wherein the lens is shaped for refraction of LED-emitted light toward the preferential side.

17. The LED light source of claim 16 wherein the lens is asymmetric.

18. The LED light source of claim 1 wherein the lens is overmolded on the submount.

19. The LED light source of claim 1 wherein the submount comprises ceramic material.

20. The LED light source of claim 19 wherein the ceramic material is aluminum nitride.

21. The LED light source of claim 1 wherein the submount has front and back sides, the LED-populated area being on the front side, and the light source further comprises electrodes on the back side.

22. The LED light source of claim 1 wherein the LED-populated area is asymmetric.

23. An LED light source configured to direct LED-emitted light toward a preferential side, the LED light source comprising:

a submount including an LED-populated area which has an aspect ratio greater than 1;

an array of LEDs on the LED-populated area, the LED array defining an emitter axis; and a lens on the submount over the LED-populated area, the lens having an outer surface and a centerline which is offset from the emitter axis toward the preferential side.

24. An LED light source configured to direct LED-emitted light toward a preferential side, the LED light source comprising:

a submount including an LED-populated area which has an aspect ratio greater than 1;

an array of LEDs on the LED-populated area, the LED-populated area having major and minor orthogonal cross-dimensions and the preferential side being along the major cross-dimension, the minor cross-dimension being defined by more than one LED, thereby providing an illumination pattern which is offset toward the preferential side with respect to the emitter axis; and a lens on the submount over the LED-populated area.

25. An LED light source configured to direct LED-emitted light toward a preferential side, the LED light source comprising:

a submount including an LED-populated area with an array of light-emitting diodes (LEDs) thereon, the LED-populated area having first and second maximum cross-dimensions orthogonal to one another where the first cross-dimension is greater than the second cross-dimension, the second cross-dimension being defined by more than one LED, the preferential side being along the first cross-dimension; and a lens on the submount over the LED-populated area.

26. The LED light source of claim 25 wherein the ratio of the first cross-dimension to the second cross-dimension of the LED-populated area is at least about 1.25.

27. The LED light source of claim 26 wherein the ratio is at least about 1.5.

28. The LED light source of claim 27 wherein the ratio is at least about 2.

29. The LED light source of claim 25 wherein the spacing and arrangement of the LEDs are such that the total LED area is at least about one-third of the LED-populated area.

30. The LED light source of claim 29 wherein the spacing and arrangement of the LEDs are such that the total LED area is at least about two-thirds of the LED-populated area.

31. The LED light source of claim 30 wherein the spacing and arrangement of the LEDs are such that the total LED area is about 90% of the LED-populated area.

32. The LED light source of claim 25 wherein the spacing between LEDs is no more than about 1 millimeter.

33. The LED light source of claim 32 wherein the spacing between LEDs is no more than about 0.5 millimeters.

34. The LED light source of claim 33 wherein the spacing between LEDs is no more than about 0.1 millimeters.

35. The LED light source of claim 34 wherein the spacing between LEDs is no more than about 0.075 millimeters.

36. The LED light source of claim 35 wherein the spacing between the LEDs is no more than about 0.05 millimeters.

37. The LED light source of claim 25 wherein the LED-populated area is rectangular.

38. The LED light source of claim 37 wherein the array includes at least eight LEDs positioned in two rows of four LEDs in each row.

39. The LED light source of claim 37 wherein the array includes forty-eight LEDs arranged in four rows of twelve LEDs in each row.

40. The LED light source of claim 25 being configured to refract LED-emitted light toward a preferential side.

41. The LED light source of claim 40 wherein the lens is shaped to direct LED-emitted light toward the preferential side.

42. The LED light source of claim 25 wherein the lens is overmolded on the submount.

43. The LED light source of claim 25 wherein the submount comprises ceramic material.

44. The LED light source of claim 43 wherein the ceramic material is aluminum nitride.

45. The LED light source of claim 25 wherein the submount has front and back sides, the LED-populated area being on the front side, and the light source further comprises electrodes on the back side.

46. The LED light source of claim 25 wherein the LED-populated area is asymmetric.

47. An LED light source configured to direct LED-emitted light toward a preferential side, the LED light source comprising:

a submount including an LED-populated area with an array of light-emitting diodes (LEDs) thereon, the LED array defining an emitter axis, the LED-populated area having first and second maximum cross-dimensions orthogonal to one another, the first cross-dimension being greater than the second cross-dimension; and a lens on the submount over the LED-populated area, the lens having an outer surface and a centerline which is offset toward the preferential side from the emitter axis.

48. The LED light source of claim 47 wherein the lens is shaped to direct LED-emitted light toward the preferential side.

49. An LED light source configured to direct LED-emitted light toward a preferential side, the LED light source comprising;

a submount including an LED-populated area which has an aspect ratio greater than 1 and major and minor orthogonal cross-dimensions, the preferential side being along the major cross-dimension;

an array of LEDs on the LED-populated area, the minor cross-dimension being defined by more than one LED; and an asymmetric lens on the submount over the LED-populated area.

50. The LED light source of claim 49 wherein the spacing and arrangement of the LEDs are such that the total LED area is at least about one-third of the LED-populated area.

51. The LED light source of claim 49 wherein the spacing and arrangement of the LEDs are such that the total LED area is at least about two-thirds of the LED-populated area.

52. The LED light source of claim 51 wherein the spacing and arrangement of the LEDs are such that the total LED area is about 90% of the LED-populated area.

53. The LED light source of claim 51 wherein the spacing between LEDs is no more than about 1 millimeter.

54. The LED light source of claim 53 wherein the spacing between LEDs is no more than about 0.5 millimeters.

55. The LED light source of claim 54 wherein the spacing between LEDs is no more than about 0.1 millimeters.

56. The LED light source of claim 55 wherein the spacing between LEDs is no more than about 0.075 millimeters.

57. The LED light source of claim 56 wherein the spacing between the LEDs is no more than about 0.05 millimeters.

58. The LED light source of claim 49 wherein the aspect ratio is at least about 1.25.

59. The LED light source of claim 58 wherein the aspect ratio is at least about 1.5.

60. The LED light source of claim 59 wherein the aspect ratio is at least about 2.

61. The LED light source of claim 49 wherein the LED-populated area is rectangular.

62. The LED light source of claim 61 wherein the array includes at least eight LEDs positioned in two rows of four LEDs in each row.

63. The LED light source of claim 61 wherein the array includes forty-eight LEDs positioned in four rows of twelve LEDs in each row.

64. The LED light source of claim 49 wherein the lens is overmolded on the submount.

65. The LED light source of claim 49 wherein the submount comprises ceramic material.

66. The LED light source of claim 65 wherein the ceramic material is aluminum nitride.

67. The LED light source of claim 49 wherein the submount has front and back sides, the LED-populated area being on the front side, and the light source further comprises electrodes on the back side.

68. The LED light source of claim 49 wherein the LED-populated area is asymmetric.

69. The LED light source of claim 68 wherein the lens is overmolded on the submount.

70. The LED light source of claim 68 wherein:

the LED array defines an emitter axis; and the lens has an outer surface and a centerline which is offset from the emitter axis toward a preferential direction.

71. The LED light source of claim 68 wherein the submount comprises ceramic material.

72. The LED light source of claim 71 wherein the ceramic material is aluminum nitride.

73. The LED light source of claim 71 wherein the submount has front and back sides, the LED-populated area being on the front side, and the light source further comprises electrodes on the back side.

74. An LED light source comprising:

a submount including an LED-populated area which has an aspect ratio greater than 1;

an array of LEDs on the LED-populated area, the LED array defining an emitter axis; and an asymmetric lens on the submount over the LED-populated area, the lens having an outer surface and a centerline which is offset from the emitter axis toward a preferential direction.

75. An LED light source comprising:

a submount including an LED-populated area which has an aspect ratio greater than 1;

an array of LEDs on the LED-populated area, the LED array defining an emitter axis, the LED-populated area having major and minor orthogonal cross-dimensions and a preferential direction being along the minor cross-dimension, the minor cross-dimension being defined by more than one LED, thereby providing an illumination pattern which is offset toward a preferential direction with respect to the emitter axis; and an asymmetric lens on the submount over the LED-populated area.

* * * * *